(12) United States Patent
Thalmayr et al.

(10) Patent No.: US 9,634,227 B1
(45) Date of Patent: Apr. 25, 2017

(54) SUPPRESSION OF SPURIOUS MODES OF VIBRATION FOR RESONATORS AND RELATED APPARATUS AND METHODS

(71) Applicant: Sand 9, Inc., Cambridge, MA (US)

(72) Inventors: Florian Thalmayr, Unterhaching (DE); Jan H. Kuypers, Cambridge, MA (US)

(73) Assignee: Analog Devices, Inc., Norwood, MA (US)

( * ) Notice: Subject to any disclaimer, the term of this patent is extended or adjusted under 35 U.S.C. 154(b) by 258 days.

(21) Appl. No.: 14/199,103

(22) Filed: Mar. 6, 2014

Related U.S. Application Data

(60) Provisional application No. 61/773,261, filed on Mar. 6, 2013.

(51) Int. Cl.
*H01L 41/053* (2006.01)

(52) U.S. Cl.
CPC .................. *H01L 41/053* (2013.01)

(58) Field of Classification Search
USPC .................................. 310/311–371
See application file for complete search history.

(56) References Cited

U.S. PATENT DOCUMENTS

| | | |
|---|---|---|
| 2,410,825 A | 11/1946 | Lane |
| 4,139,793 A | 2/1979 | Michel |
| 4,443,728 A | 4/1984 | Kudo |
| 4,609,844 A | 9/1986 | Nakamura et al. |
| 4,900,971 A | 2/1990 | Kawashima |
| 5,001,383 A | 3/1991 | Kawashima |
| 5,025,346 A | 6/1991 | Tang et al. |
| 5,640,133 A | 6/1997 | MacDonald et al. |
| 5,914,553 A | 6/1999 | Adams et al. |
| 6,124,765 A | 9/2000 | Chan et al. |
| 6,739,190 B2 | 5/2004 | Hsu et al. |
| 6,828,713 B2 | 12/2004 | Bradley et al. |
| 6,909,221 B2 | 6/2005 | Ayazi et al. |
| 6,930,569 B2 | 8/2005 | Hsu |
| 6,943,484 B2 | 9/2005 | Clark et al. |

(Continued)

FOREIGN PATENT DOCUMENTS

| | | |
|---|---|---|
| WO | WO 98/01948 A1 | 1/1998 |
| WO | WO 02/17481 A2 | 2/2002 |

(Continued)

OTHER PUBLICATIONS

Humad et al., "High frequency micromechanical piezo-on-silicon block resonators," Int'l Electron Devices Meeting 2003IEDM. Technical Digest, Washington, D.C. Dec. 8-10, 2003, New York, NY: IEEE US Dec. 8, 2003, pp. 957-960.

(Continued)

*Primary Examiner* — Thomas Dougherty
(74) *Attorney, Agent, or Firm* — Wolf, Greenfield & Sacks, P.C.

(57) ABSTRACT

Suppression of spurious modes of vibration for resonators and related apparatus and methods. A device may include a MEMS resonating structure, a substrate, and anchors between the MEMS resonating structure and the substrate. The MEMS resonating structure may have at least one main eigenmode of vibration and at least one spurious eigenmode of vibration. The anchors may be configured to suppress the response of the at least one spurious mode of vibration.

20 Claims, 17 Drawing Sheets

(56) References Cited

U.S. PATENT DOCUMENTS

| | | |
|---|---|---|
| 6,954,020 B2 | 10/2005 | Ma et al. |
| 6,985,051 B2 | 1/2006 | Nguyen et al. |
| 6,995,622 B2 | 2/2006 | Partridge et al. |
| 7,005,946 B2 | 2/2006 | Duwel et al. |
| 7,211,926 B2 | 5/2007 | Quevy et al. |
| 7,215,061 B2 | 5/2007 | Kihara et al. |
| 7,352,608 B2 | 4/2008 | Mohanty et al. |
| 7,492,241 B2 | 2/2009 | Piazza et al. |
| 7,504,909 B2 | 3/2009 | Tada |
| 7,667,369 B2 | 2/2010 | Haskell et al. |
| 7,724,103 B2 | 5/2010 | Feng et al. |
| 7,791,432 B2 | 9/2010 | Piazza et al. |
| 7,886,575 B2 | 2/2011 | Haskell et al. |
| 8,174,170 B1 | 5/2012 | Kuypers et al. |
| 8,446,078 B2* | 5/2013 | Bahreyni ............ H03H 9/02338 310/334 |
| 8,624,471 B1* | 1/2014 | Ayazi ................ H03H 9/02338 310/351 |
| 8,887,568 B2* | 11/2014 | Forke .................... B81B 3/0078 73/514.32 |
| 9,299,910 B1* | 3/2016 | Sparks .................. H01L 41/053 |
| 2003/0117237 A1 | 6/2003 | Niu et al. |
| 2004/0207492 A1* | 10/2004 | Nguyen ............... H03H 3/0072 333/199 |
| 2005/0073078 A1 | 4/2005 | Lutz et al. |
| 2007/0013464 A1 | 1/2007 | Pan Zhiyu et al. |
| 2007/0052498 A1 | 3/2007 | Pan Zhiyu et al. |
| 2008/0143217 A1 | 6/2008 | Ho et al. |
| 2008/0204153 A1 | 8/2008 | Yoshida et al. |
| 2008/0272852 A1 | 11/2008 | Six |
| 2009/0108381 A1 | 4/2009 | Buchwalter et al. |
| 2009/0108959 A1 | 4/2009 | Piazza et al. |
| 2009/0144963 A1 | 6/2009 | Piazza et al. |
| 2009/0243747 A1 | 10/2009 | Gaidarzhy et al. |
| 2009/0294638 A1 | 12/2009 | Mohanty et al. |
| 2010/0007443 A1 | 1/2010 | Mohanty et al. |
| 2010/0026136 A1 | 2/2010 | Gaidarzhy et al. |
| 2010/0134207 A1 | 6/2010 | Mohanty et al. |
| 2010/0155883 A1 | 6/2010 | Wenzler et al. |
| 2010/0181868 A1 | 7/2010 | Gaidarzhy et al. |
| 2010/0182102 A1 | 7/2010 | Kuypers et al. |
| 2010/0314969 A1 | 12/2010 | Gaidarzhy et al. |
| 2012/0074810 A1 | 3/2012 | Chen et al. |
| 2012/0262242 A1* | 10/2012 | van der Avoort .. H03H 9/02338 331/154 |
| 2012/0280594 A1 | 11/2012 | Chen et al. |

FOREIGN PATENT DOCUMENTS

| | | |
|---|---|---|
| WO | WO 2006/000611 A1 | 1/2006 |
| WO | WO 2006/083482 A2 | 8/2006 |
| WO | WO 2006/124303 A1 | 11/2006 |
| WO | WO 2010/011288 A1 | 1/2010 |

OTHER PUBLICATIONS

International Search Report and Written Opinion from International Application No. PCT/US2010/000921 mailed Jul. 8, 2010.

International Search Report and International Preliminary Report on Patentability for PCT/US2006/021298 mailed Nov. 6, 2006 and Dec. 6, 2007 respectively.

Kaajakari et al., "Square-Extensional Mode Single-Crystal Silicon Micromechanical Resonator for Low-Phase-Noise Oscillator Applications," *IEEE Electron Device Letters* 25(4):173 (2004).

Khine et al., "7MHz length-extensional SOI resonators with T-shaped anchors," Solid-State Sensors, Actuators and Microsystems Conference: Transducers, Piscataway, NJ, US, Jun. 21, 2009.

Piazza et al., "Low motional resistance ring-shaped contour-mode aluminum nitride piezoelectric micromechanical resonators for UHF applications," Micro Electro Mechanical Systems, 2005. MEMS 2005. 18$^{th}$ IEEE International Conference on Miami Beach, Florida, Jan. 30-Feb. 3, 2005, Piscataway, New Jersey, US, IEEE Jan. 30, 2005, pp. 20-23.

Tirole et al., "Lamb Waves Pressure Sensor Using an A N/Si Structure," Proceedings Ultrasonics Symposium, Oct. 31, 1993-Nov. 3, 1993, Baltimore, MD, IEEE 1993 vol. 1, pp. 371-374.

Sorenson, L. et al., One Dimensional Linear Acoustic Bandgap Structures for Performance Enhancement of ALN-On-Silicon Micromechanical Resonators, Solid-State Sensors, Actuators and Microsystems Conference (TRANSDUCERS), 2011 16th International, pp. 918-921.

Hsu, Feng-Chia et al., Phononic Crystal strips for engineering Micromechanical Resonators, Proc. SPIE 8269, Photonic and Phononic Properties of Engineered Nanostructures II, Feb. 9, 2012.

* cited by examiner

SUPPRESSION OF SPURIOUS MODES OF VIBRATION FOR RESONATORS AND RELATED APPARATUS AND METHODS

CROSS-REFERENCE TO RELATED APPLICATIONS

This Application claims the benefit under 35 U.S.C. §119(e) of U.S. Provisional Application Ser. No. 61/773,261 titled "Suppression of Spurious Modes of Vibration for Resonators and Related Apparatus and Methods" filed on Mar. 6, 2013, which is hereby incorporated herein by reference in its entirety.

BACKGROUND

Field

The technology described herein relates to the suppression of spurious modes of vibration for resonators and related apparatus and methods. In some embodiments, methods and apparatus for suppressing the unwanted modes is provided by proper anchor design.

Related Art

Microelectromechanical systems (MEMS) are small mechanical structures with integrated electromechanical transducers to induce and/or detect their mechanical motion. Examples of MEMS devices include oscillators, accelerometers, gyroscopes, microphones, pressure sensors, switches, filters, and resonators. MEMS resonators may be used as resonators in, for example, oscillator circuits, acoustic frequency filters, acoustic sensors, gyroscopes, temperature sensors, and chemical sensors.

Important performance metrics of resonators, such as piezoelectric Lamb wave resonators, include the quality factor of the vibration and the absence of spurious vibrations close to the resonance frequency of the resonator.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same reference number in all the figures in which they appear.

SUMMARY

According to an aspect of the present disclosure, a device is provided, comprising: a micro-electromechanical (MEMS) resonating structure, a substrate, and anchors between the MEMS resonating structure and the substrate, wherein the MEMS resonating structure has at least one main eigenmode of vibration and at least one spurious eigenmode of vibration, and wherein the anchors are configured to suppress the response of the at least one spurious mode of vibration.

DETAILED DESCRIPTION

Introductory Concepts

Resonators in general and micro-electro-mechanical (MEMS) resonators in particular, are used in various applications such as filters, oscillators and sensor systems. As in any vibrating body, a MEMS resonator supports multiple modes of vibration, where there is usually only a single desired and utilized mode of vibration and an infinite multitude of undesired modes of vibration.

Depending on the resonator application, the unwanted modes of vibration may have several negative effects, e.g.:

(1) Oscillator circuits may start to resonate on the unwanted mode of vibration with completely different frequency, phase noise (PN) performance and different temperature stability;

(2) Unwanted resonator modes of vibration in filter applications may increase the passband insertion loss (IL) and decrease the out-of-band rejection, deteriorating the overall filter performance; or (3) A sensor signal may be misinterpreted.

Therefore, in some scenarios, an essential design goal for resonators is the suppression of unwanted modes of vibration. For bulk-acoustic wave resonators and surface acoustic wave resonators there are several strategies available for the suppression of unwanted spurious modes, specifically in filter applications. However for MEMS resonators which basically consist of a vibrating plate anchored on several nodal points to a substrate, no suitable method has been yet proposed to suppress the spurious modes of vibration.

According to an aspect of the present disclosure, a design method is described for the suppression of spurious modes of vibration. According to other aspects of this application, a design method is described for suppression of spurious modes of vibration, while keeping the quality factor of resonance of the main mode at the maximum practical limit.

Applicants have appreciated that the quality factor of spurious modes can be lowered (and hence the mode can be suppressed) by design of the anchors so that they are transmissive for the specific type of vibration of the spurious mode at the specific frequency of resonance of the spurious mode of vibration. According to an aspect of the described technology, the suppression of the spurious mode is achieved by modifying the anchor eigenmode frequencies. According to some embodiments, the anchor contains elements designed as a phononic crystal consisting of repeating structures.

Figure 1A:
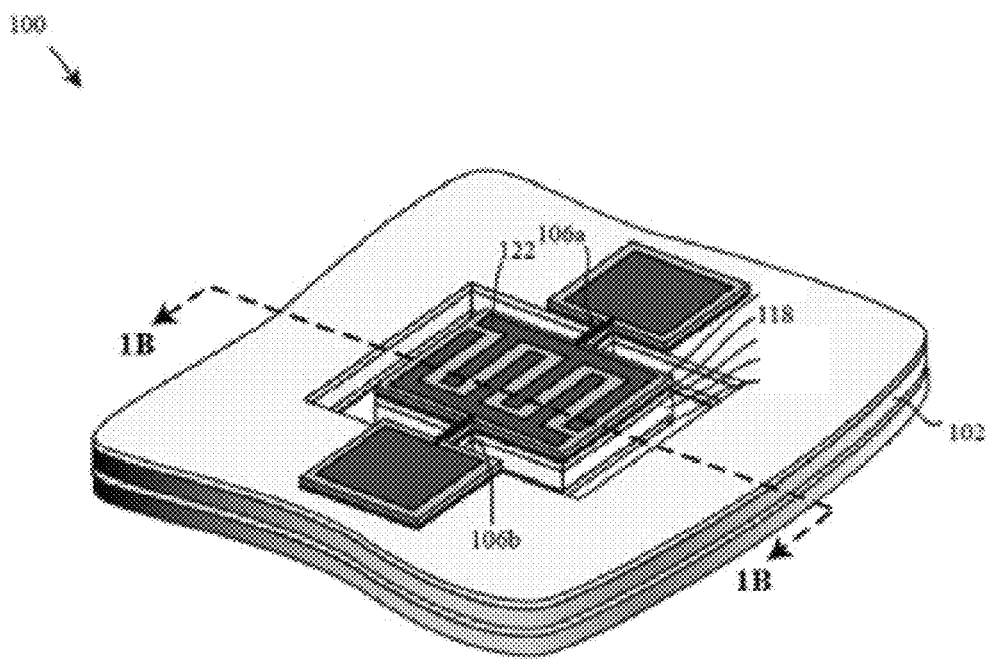
FIGS. 1A and 1B are schematic illustrations of, respectively, a perspective view and a cross-sectional view of a MEMS resonator, according to a non-limiting embodiment of the present disclosure.
Figure 1B:
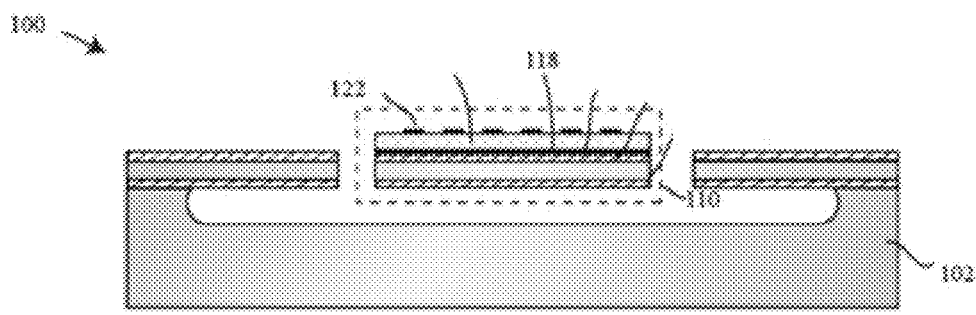

A non-limiting example of an unpackaged MEMS resonator, specifically a Lamb mode resonator is shown in FIG. 1. The resonator 100 comprises a resonating structure ("plate") 110 connected over anchor points 106a and 106b to a substrate 102. The actuation can be piezoelectric, electrostatic, or any other suitable method. The resonator may comprise electrodes (here 118 and 122), which may be optimized for excitation of the main mode of vibration. In an ideal resonator, the plate sustains a standing acoustic wave at the frequency of interest. Loss of energy occurs due to leakage of the acoustic wave through the anchors 106 and into the surrounding substrate 102.

Though shown in this way for the purpose of illustration, it has to be emphasized that anchoring is not limited to the displayed number, position and shape of anchors 106a and 106b, but any suitable configuration is possible. It should be appreciated, that anchors are often connected to the resonator substantially at nodes of vibration of the main mode to minimize energy losses deteriorating the device quality factor of vibration.

Figure 2:
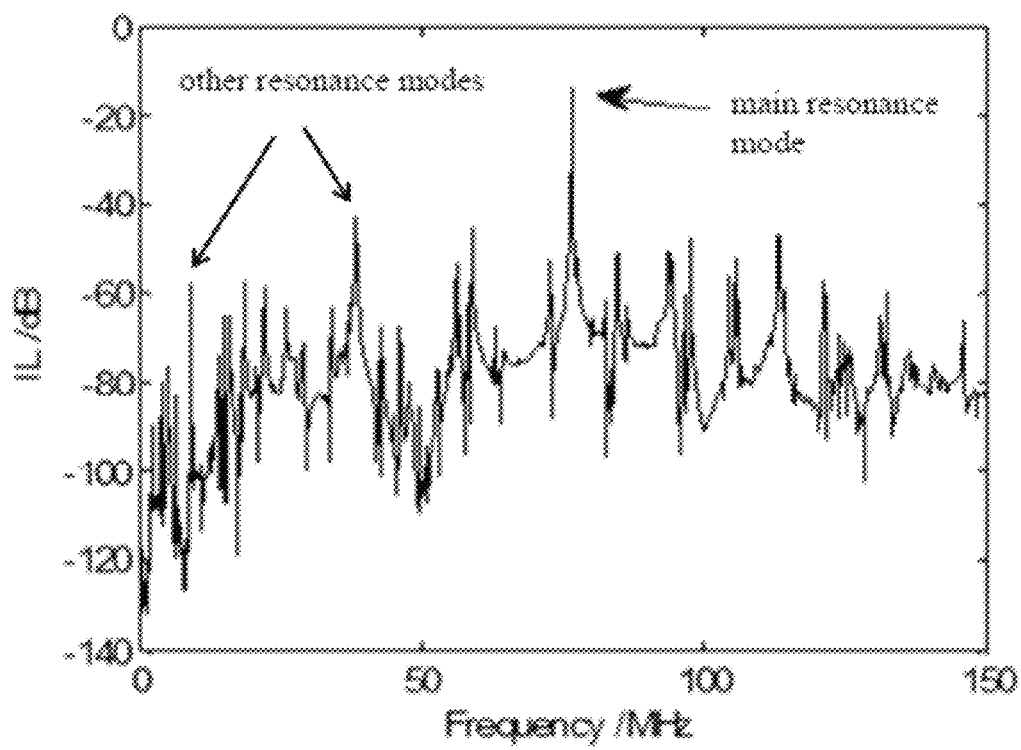
FIG. 2 illustrates insertion loss (IL) of a resonator, according to a non-limiting embodiment.

When measuring the electrical response of a MEMS resonator, e.g., in terms of scattering parameters, each electrical excitable mode shows up as a resonance peak with a certain insertion loss (IL). FIG. 2 shows a non-limiting example of the frequency spectrum of the insertion loss (IL) of a resonator over a wide frequency range. In the example of FIG. 2, the resonator is a Lamb wave MEMS resonator. As indicated by the spectrum of FIG. 2, the resonator is configured to excite and exhibit many other resonance modes in addition to the primary resonance mode. The insertion loss at any frequency is defined by $$IL = -20\log_{10}(|S21|), \quad (1.1)$$

For a particular mode of vibration, the transmission magnitude S21 IL of a two-port resonator can be calculated as $$IL = -20\log_{10}\left(\frac{2Z_0}{2Z_0 + R_m}\right), \quad (1.2)$$

for each individual mode, where $Z_0$ is the characteristic impedance of the system and $R_m$ is the motional equivalent circuit resistance of the mode.

$R_m$ can be represented as $$R_m = \left(\frac{8}{\pi^2 \omega_0 Q k_{geom}^2 k_{mode}^2 C_0}\right), \quad (2)$$

with $C_0$ is the static electrode capacitance, $\omega_0$ and Q are the frequency of resonance and the quality factor of the respective mode. The term $k_{geom}^2 k_{mode}^2$ is the coupling factor of the respective mode, which is the product of the geometrical coupling coefficient $k_{geom}^2$ and the electromechanical coupling coefficient of the mode for the specific stack $k_{mode}^2$. The geometrical coupling coefficient $k_{geom}^2$ is determined by the similarity of the in-plane (spatial) electrical field of the mode to the field generated by the electrodes. The mode coupling for the specific stack $k_{mode}^2$ is dominated by material properties and stack layer thicknesses and can be considered fixed for a particular mode type and fabrication process.

The quality factor of resonance Q is a function of the acoustic, the viscous and other losses (e.g. material, surface or thermo-mechanic) losses $$\frac{1}{Q} = \frac{1}{Q_{acoustic}} + \frac{1}{Q_{viscous}} + \frac{1}{Q_{other}}, \quad (3)$$

and usually one loss mechanism is dominant. This holds true for all modes of vibration and for different modes of vibration there may be different dominant loss mechanisms.

For the main mode of resonance it is usually desired to get either a specific or as high as possible Q factor to obtain either a specific Rm matching the circuit impedance or an as-low-as-possible Rm. This is usually achieved by designing the anchor and the plate vibration to control/minimize the acoustic losses. It should be appreciated that the design of the anchors with regard to the Q of the main mode of vibration is already challenging task in itself and the number of parameters for designing the anchors is usually limited by additional constraints such as manufacturability, mechanical stability, etc.

The 2D geometric coupling coefficient $k_{geom}^2$ is optimized to $k_{geom}^2 \to 1$ for the main mode of vibration by the electrode pattern and for the majority of other modes it is $k_{geom}^2 \to 0$ and hence even for a high quality factor of vibration it can be derived from eq. (2) that these modes are very weakly pronounced as having a high motional resistance.

However, there are usually few other spurious modes, where the $k_{geom}^2 \to 1$ and hence these modes may show low IL if their Q is high. E.g. designing the anchors for the minimization of acoustic losses of the main mode may also cause the minimization of acoustic losses for certain spurious modes. Especially pronounced are modes which have the same wavelength as the main mode of vibration and hence as well $k_{geom}^2 \to 1$ as the anchor has the same acoustic transmission line behavior for those modes.

Anchor Design for Spurious Mode Suppression

Figure 3A:
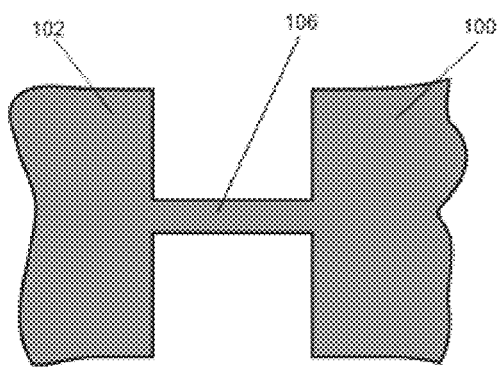
FIG. 3A is a schematic illustration of an anchor structure, according to some embodiments.
Figure 3B:
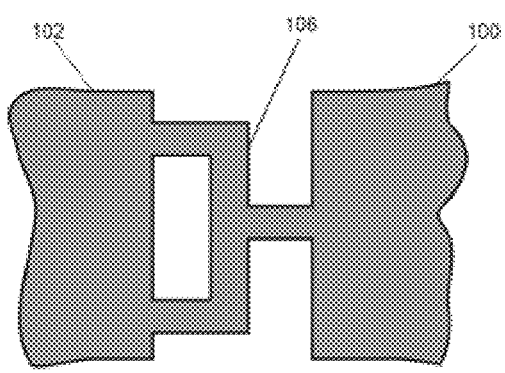
FIG. 3B is a schematic illustration of another anchor structure, according to some embodiments.
Figure 3C:
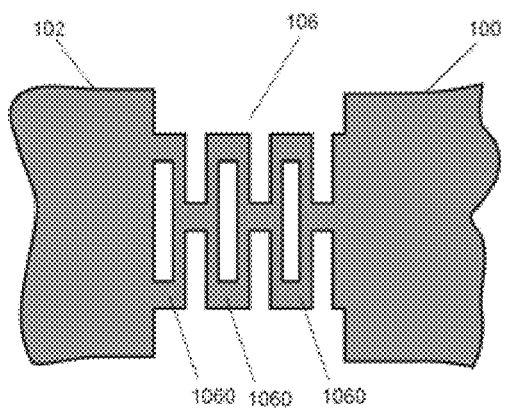
FIG. 3C is a schematic illustration of another anchor structure, according to some embodiments.

As a non-limiting example, FIGS. 3A-3C show structures used as anchors in MEMS resonators, e.g. a straight bar in FIG. 3A, a compliant crossbar structure FIG. 3B, a repetitive tether structure in FIG. 3C. The latter is consisting of a multitude of repetitive structures 1060. Each of the anchor structure connects resonator 100 to substrate 102. One can identify that each of the anchor structures has several design degrees of freedom (DOF), denoted as "anchor DOF" in the following. For the straight bar anchor in FIG. 3A this would be e.g. the length and the width of the bar, for the crossbar structure in FIG. 3B, this would be the length and width of each individual segment and for the repetitive structure in FIG. 3C this would be the number of repetition length and width of each individual segment.

It should be appreciated that the anchor DOFs are chosen with respect to several requirements: minimum critical dimension (CD) width (may be determined by the manufacturability); mechanical stability (shock resistance); mechanical compliance (stress relief); and quality factor of main resonance.

Of the general available anchor DOFs, the majority is usually constrained by secondary requirements and there may remain only few anchor DOFs, and for design purposes one anchor DOF may be chosen as the real independent design parameter. For example, for the straight bar in FIG. 3A, the width of the bar may be constrained by the minimum CD width and the bar length is the real design DOF.

This application describes methods and apparatus to explicitly lower the quality factor of resonance of one or multiple spurious mode of vibration by proper anchor design. The acoustic losses $1/Q_{acoustic}$ in eq. (3) is the energy, which is not dissipated in the resonator itself, but which is radiated from the plate 110 over the anchors 106 to the surrounding substrate 102.

Theses acoustic losses are proportional to the acoustic transmissivity of the anchor, which is a measure of how effective acoustic energy can be transferred between the two ends of the anchors. It should be appreciated that the acoustic transmissivity is dependent on the frequency and different for each mode of vibration.

The acoustic transmissisivity of the anchor can be obtained from the acoustic admittance matrix Y seen at the interface A (normal vector n) between the anchor and the resonator body, while the other end of the anchor is acoustically terminated with the substrate. The acoustic admittance matrix Y is defined over $$v = YT, \quad (4)$$

where v is the velocity vector and T is the stress tensor. The power P which is transmitted over surface A can be calculated as $$P = \frac{1}{2} \int_A (Y^*T^*T) n \, dA, \quad (5)$$

where Re(P) is the power which is effectively transmitted ("lost") over the anchor, while Im(P) is the power which is stored in the anchor. Therefore the real and imaginary part of the acoustic admittance matrix components are a measure for "power transmissivity" and "power storage capability", respectively, at a given frequency when applying specific stress components. Furthermore, for a specific mode of vibration with a specific spatial stress tensor distribution on surface A, a scalar effective acoustic admittance $Y_{ac}$ of the anchor at any given frequency can be calculated.

Figure 4:
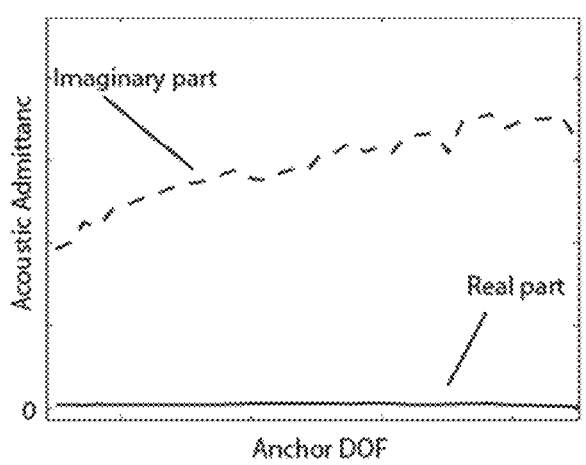
FIG. 4 illustrates acoustic admittance of an anchor, according to a non-limiting embodiment.

It should be appreciated that for anchors consisting of simple geometries as shown in FIGS. 3A and 3B, the effective acoustic admittance is fairly constant over a wide range for varying anchor DOF. FIG. 4 shows for example the simulated effective acoustic admittance for the spurious mode of vibration as real part and imaginary part for the anchor geometry shown in FIG. 3B. The anchor DOF in FIG. 4 was chosen to be the crossbar length. With increasing crossbar length, the imaginary part of the acoustic admittance increases as the anchor can store more power in the crossbar. The real part remains close to 0 indicating that the anchor is not suitable for effective transmission of power of the spurious mode from the plate to the substrate.

Figure 5:
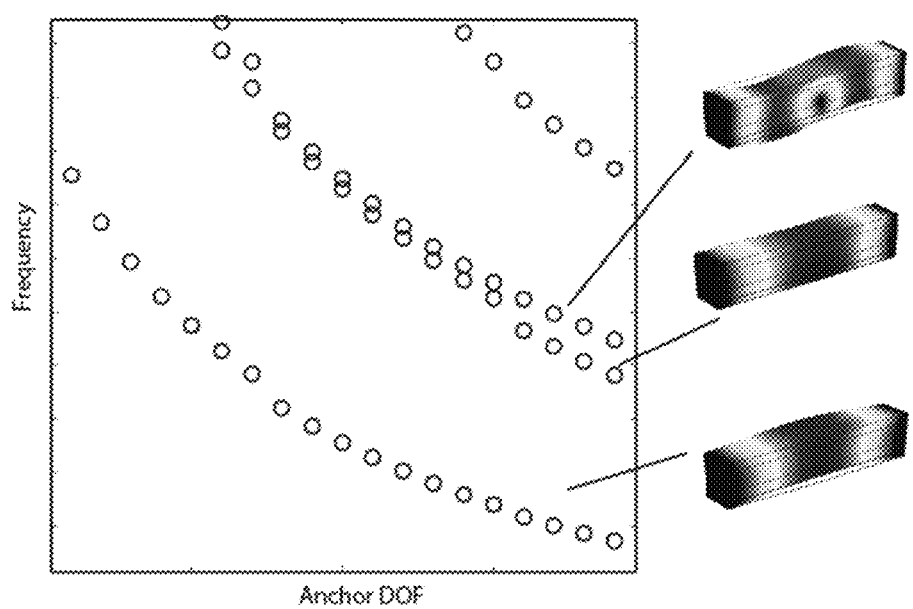
FIG. 5 illustrates eigenmode spectra of modes of an anchor, according to some embodiments.

Just like the resonator itself, also the anchors have eigenmodes of vibrations. FIG. 5 exemplarily shows the frequency spectra of eigenmodes (e.g., lowest-order modes) of the straight bar anchor of FIG. 3A, where the anchor DOF is the bar length and the bar being clamped at both ends. Several modes can be identified with different dominant displacement type—e.g. in-plane and out-of-plane—and the resonance frequency of the eigenmodes are strongly dependent on the length of the crossbar. It should be appreciated that the eigenmodes of the anchor connected to the resonator and the substrate substantially are very similar in mode shape and frequency as the modes of vibration of the free anchor. Anchor eigenmodes can be identified in simulation containing the resonator, the anchors and the substrate by mode shape analysis.

In some embodiments wherein specific spurious modes of vibration are suppressed, the anchor is specifically designed so that a suitable anchor eigenmode of vibration is substantially at the resonance frequency of a spurious mode of vibration. It should be appreciated that anchor design here means "choosing the anchor DOF," where DOF can be one or multiple geometrical and material parameter.

Figure 6A:
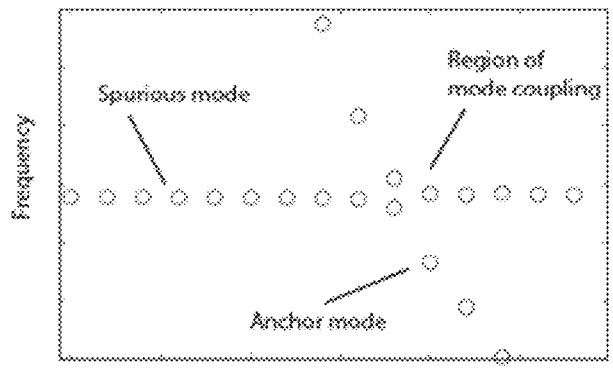
FIG. 6A illustrates a combined eigenmode spectrum of a resonator and an anchor, according to some embodiments.
Figure 6B:
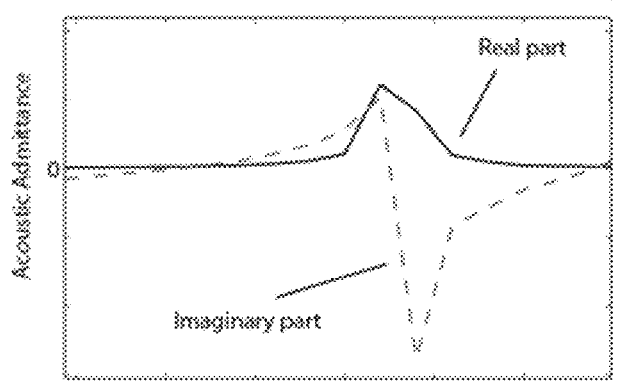
FIG. 6B illustrates effective acoustic admittance of a spurious mode at a cross-section between resonator and plate, according to some embodiments.

These principles are demonstrated in the following by means of a non-limiting example. FIG. 6A shows the combined eigenmode spectrum of a resonator, the anchor and the substrate in frequency proximity of the spurious mode of vibration in the resonator for varying the anchor DOF. Here, the anchor DOF is chosen so that in addition to the spurious mode of vibration, there also exists an anchor mode of vibration. As the spurious mode of vibration occurs in the resonator, the resonance frequency of this mode does not change for alternation of the anchor/variation of the anchor DOF. In contrast to that, the frequency of the eigenmode in the anchor varies heavily with variation of the anchor DOF.

As spurious mode frequency is constant, while anchor mode frequency varies, there is an imaginary point in FIG. 6A, where both lines would cross and both frequencies would coincide. However, as the both resonant bodies are connected, the modes mutually couple to each other and instead of a real crossing it can be observed that the branches bifurcate in the region of mode coupling.

Figure 7A:
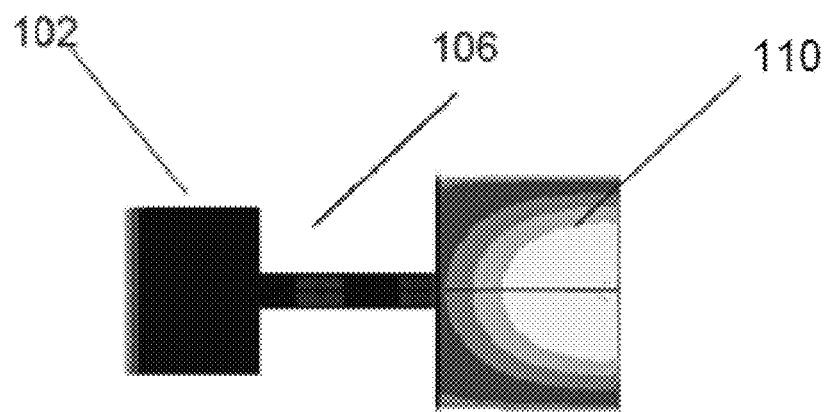
FIG. 7A illustrates displacement of a resonator for an uncoupled spurious mode vibration.
Figure 7B:
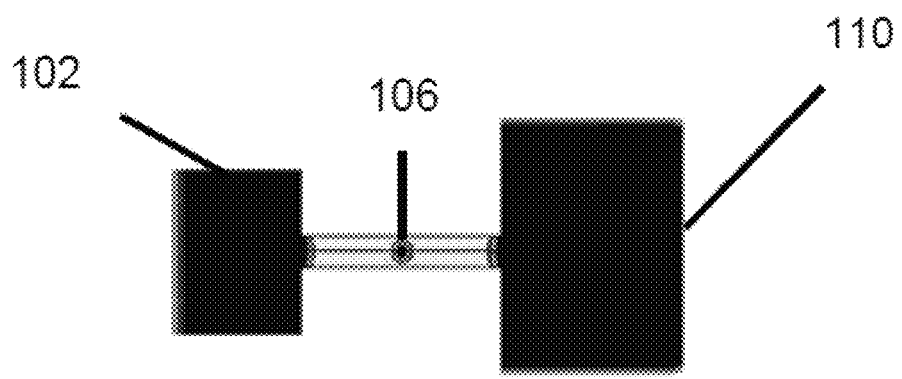
FIG. 7B illustrates displacement of a resonator for an uncoupled anchor eigenmode vibration.
Figure 7C:
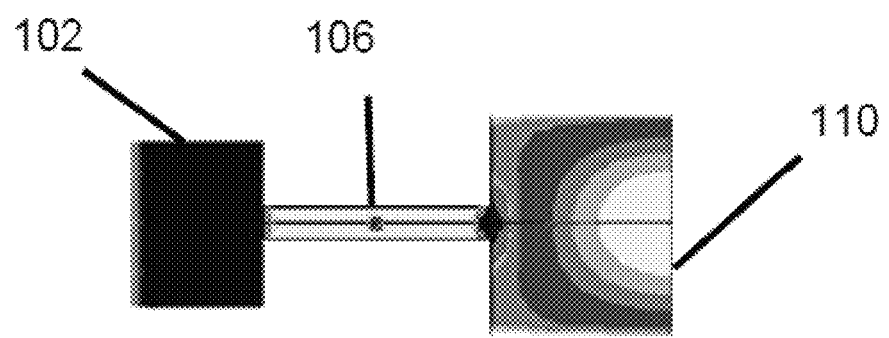
FIG. 7C illustrates displacement of a resonator for coupled vibration of a spurious mode and an anchor mode; according to some embodiments.
Figure 8A:
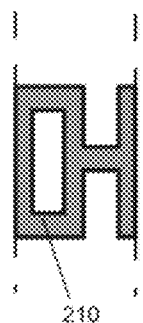
FIG. 8A is a schematic illustration of an anchor structure, according to some embodiments.
Figure 8B:
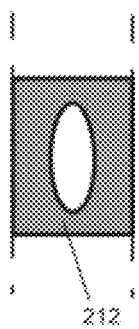
FIG. 8B is a schematic illustration of another anchor structure, according to some embodiments.
Figure 8C:
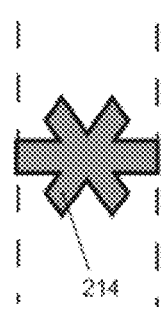
FIG. 8C is a schematic illustration of another anchor structure, according to some embodiments.
Figure 8D:
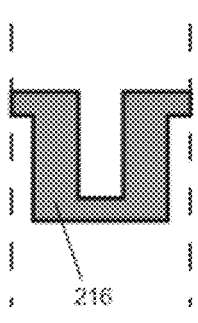
FIG. 8D is a schematic illustration of another anchor structure, according to some embodiments.
Figure 8E:
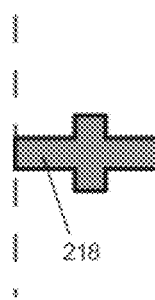
FIG. 8E is a schematic illustration of another anchor structure, according to some embodiments.
Figure 8F:
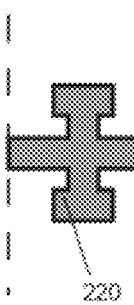
FIG. 8F is a schematic illustration of another anchor structure, according to some embodiments.
Figure 8G:
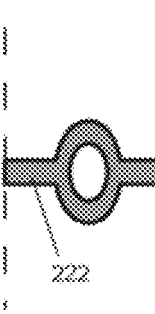
FIG. 8G is a schematic illustration of another anchor structure, according to some embodiments.
Figure 8H:
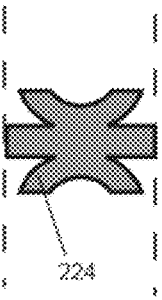
FIG. 8H is a schematic illustration of another anchor structure, according to some embodiments.

In the region of modal coupling, the spurious mode of vibration in the resonator and the eigenmode of the anchor resonate together in a single vibration shape. FIGS. 7A-7C illustrate this phenomena. Specifically, FIG. 7A illustrates simulated displacement of a resonator for an uncoupled spurious mode vibration. FIG. 7B illustrates simulated displacement of a resonator for an uncoupled anchor eigenmode vibration. FIG. 7C illustrates simulated displacement of a resonator for coupled vibration of a spurious mode and an anchor mode. That is, in FIG. 7C, the spurious mode of vibration, which is usually confined to the resonator, now also resonates in the anchor and energy is transferred very easily between the plate and the anchor, and hence also between the plate and the substrate.

FIG. 5B exposes this effect in terms of the acoustic admittance. At the anchor eigenmode of vibration, the acoustic admittance behaves analogous to the electrical admittance in a lossy resonator. The phase of the acoustic admittance changes phase and the conductance maximizes. As pointed out above, this means that "conducted" power and hence the losses to the substrate are maximized.

Figure 6C:
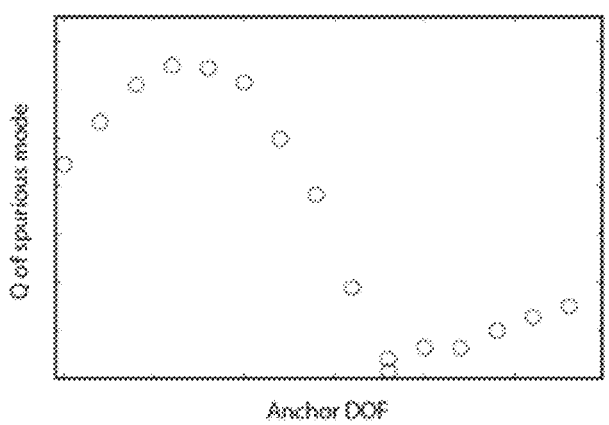
FIG. 6C illustrates a quality factor of resonance of a spurious mode of vibration, according to some embodiments.

The effect of the maximization of acoustic losses on the quality factor of resonance of the spurious mode is shown in FIG. 6C. As the acoustic conductance maximizes, the quality factor of the spurious mode experiences a local minima It should be appreciated that the above described method of suppressing spurious modes by anchor eigenmodes may take into account the mode symmetry. As a non-limiting-example, for the resonator being symmetric from the top and the anchor being connected to the resonator on the line of symmetry it is only possible to suppress a symmetric spurious mode with a symmetric anchor mode; likewise, an anti-symmetric mode can be suppressed only with an anti-symmetric anchor mode. It should be appreciated that this also implies that for an entirely symmetric stack, it is possible to suppress the spurious symmetric in-plane-modes only with in-plane anchor modes. The same holds true for anti-symmetric modes.

For non-symmetric stacks, though, it should be appreciated that modes are not entirely symmetric or anti-symmetric anymore, wherefore it is possible to suppress a substantially in-plane resonator mode with a substantially out-of-plane anchor mode. It has to be emphasized though that suppression is more effective if the resonator mode and the anchor mode are as similar as possible in terms of mode symmetry (as this increases the mutual coupling).

Figure 6D:
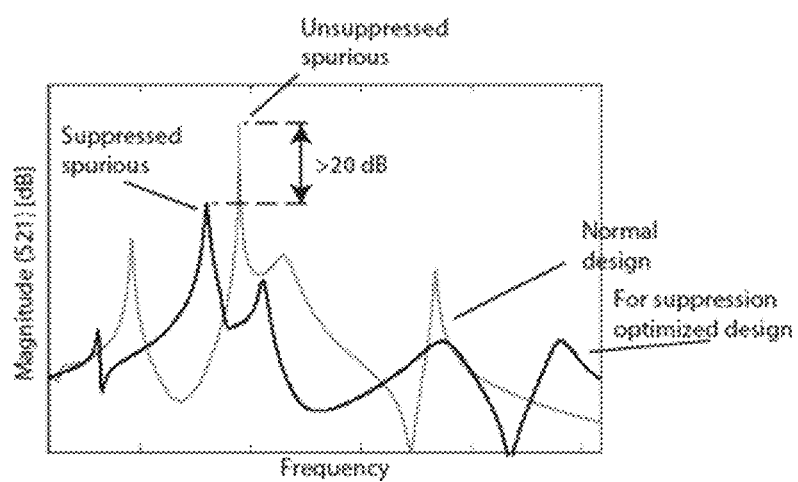
FIG. 6D illustrates RF (radio frequency) response of a resonator around a spurious mode of vibration for a conventional design and a suppressed design, according to some embodiments.

FIG. 6D illustrates RF response of a resonator around a spurious mode of vibration for a conventional design and a suppressed design.

In FIGS. 6A-6D, the data are obtained by FEM simulation, and the graphs are functions of the anchor DOF.

Phononic Crystal (PC) Anchor Structures

It should be appreciated that the above method for suppression of specific spurious modes can be applied to any suitable anchor structure by varying the anchor DOFs. As mentioned above, it is desirable to design the resonator with regard to several aspects besides the suppression of spurious modes—e.g. the quality factor of the main resonance. After the application of the proposed strategy for spurious mode suppression, one may or may not have obtained a suitable quality factor for the main resonance by changing a single anchor DOF. In many cases where the main resonance is not-limited by acoustic damping or the system is not too sensitive to the quality factor, the anchor optimization by altering a single anchor DOF with regard to spurious mode may suffice. For the main resonance being determined by the acoustic damping over the anchor, it may be necessary to consider additional anchor DOFs and to solve the non-linear optimization problem for simultaneous suppression of spurious modes and improvement of main resonance quality factor.

In the following methods and apparatus are described to simultaneously obtain high quality factor of resonance and suppress spurious modes of vibration. As shown in FIG. 3C, also repetitive structures are suitable for anchoring the resonator to the substrate. These repetitive structures may be regarded as 1D-phononic crystals (PC) comprising or consisting of single unit cells. As they have a periodic variation of their acoustic properties, they may be regarded as an acoustic meta-material having an acoustic wave dispersion, which is significantly different from that of the plane wave propagation in a non-repetitive structure such as shown in FIGS. 3A and 3B.

Non-limiting examples of single unit cells for repetitive structures are shown in FIGS. 8A-8H, which are e.g. the tether-like structure 210, the ellipsoid-hole structure 212, the double crossed-bar structure 214, the meander 216, the crossed-bar structure 218, the mass-loaded crossed-bar structure 220, the ring 222, and the butterfly 224. It should be appreciated that there is an infinite amount of possible repetitive structures consisting of variation of two acoustic media, though again there may the additional constraints as listed above.

Figure 9:
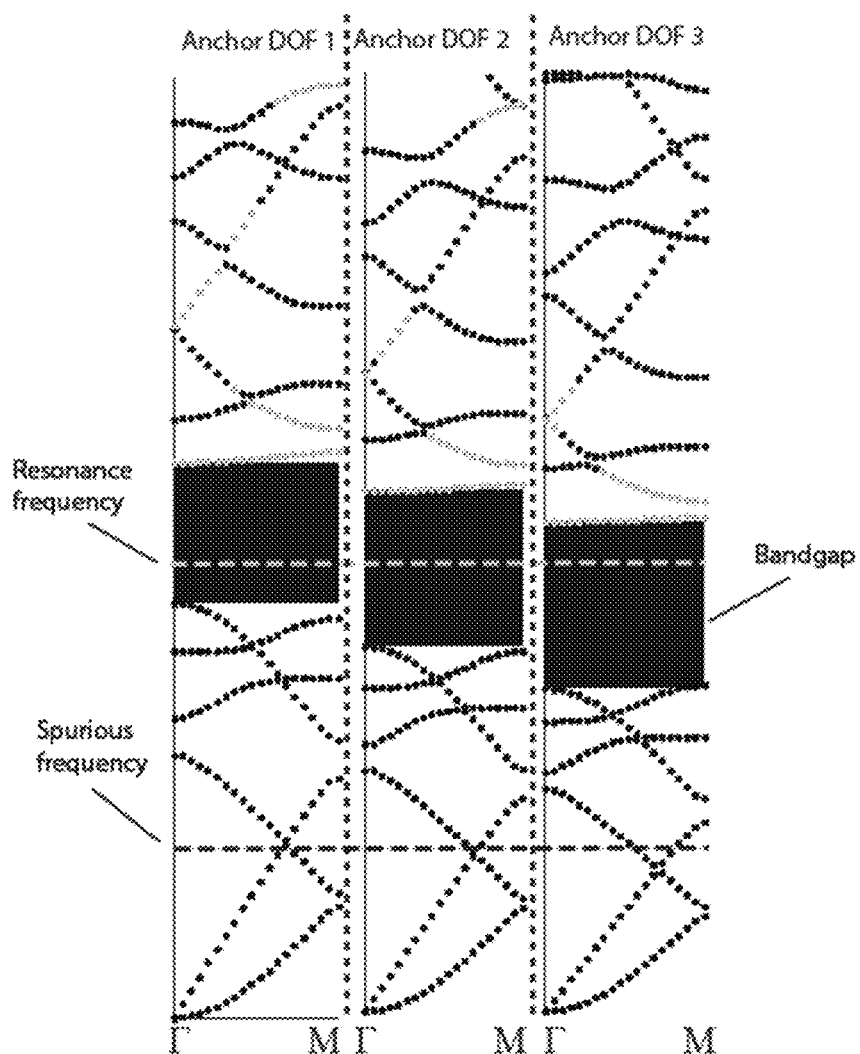
FIG. 9 illustrates eigenmode dispersion of a single unit cell for three different anchor DOF, according to some embodiments.

To analyze and understand the properties of wave-propagation in the repetitive structure it is sufficient to obtain the frequency vs. lateral wavenumber dispersion of a single unit cell by applying the Floquet-Bloch theorem over all possible wave-numbers from F to M. Exemplarily the result of the application of this method is shown in FIG. 9 for the specific unit cell type 210 under variation of the anchor DOF "cross-bar length" for three different length (denoted as "anchor DOF 1", "anchor DOF 2" and "anchor DOF 3"). Each dot denotes an eigenmode solution and it can be observed that for the majority of frequencies there exist one or multiple eigenmodes. This means that acoustic energy can propagate infinitely wide in the periodic structure. This additionally also implies that there may exist eigenmodes of vibration in the anchor.

On the other hand, for some frequencies in the regarded structure and for the regarded parameter set, there does not exist a single possible eigenmode solution, which implies that acoustic energy cannot propagate in the anchor. This means that acoustic waves cannot propagate through a periodic structure at this frequency, what is called a phononic bandgap. Energy at these frequencies can only propagate over finite distance in terms of energy tunneling.

It should be noted that there are again different symmetry types of eigenmodes and with regard to a possible symmetry of the cross-section, top-view of the resonator and the anchor location one has to consider only modes of the same type of symmetry as the main and spurious mode of vibration. E.g. there may exist partial band-gaps for specific mode symmetries, which may be sufficient to consider.

Suppression of Spurious Modes with Phononic Crystal (PC) Anchor Structures

The following paragraphs specifically describe how to design a resonator with a high quality factor of resonance and a suppression of one or multiple spurious modes by the usage of a phononic crystal/repetitive anchor structure.

To achieve a high quality factor of the main resonance, one has to:

1. Choose the anchor DOF so that the resonance frequency of the main resonance is in the acoustic bandgap.

2. Construct the repetitive anchor from a sufficiently large number N of unit cells so that tunneling of energy is insignificant and $Q_{acoustic} \gg Q$. This results in the main resonance quality factor being not dependent on acoustic losses anymore and eq. (3) reduces to $$\frac{1}{Q} = \frac{1}{Q_{viscous}} + \frac{1}{Q_{other}}.$$

Even for (slight) variation of the anchor DOF, one will obtain a substantially constant quality factor of resonance.

For suppression of spurious modes of vibration with the PC anchor, one has to perform two additional steps:

3. Choose the anchor DOF so that the resonance frequency of spurious mode is not in an acoustic bandgap 4. Vary the anchor DOF of each single repetitive element and number of the repetitive elements so that there is an eigenmode of resonance at the frequency of the spurious mode of vibration.

Figure 10:
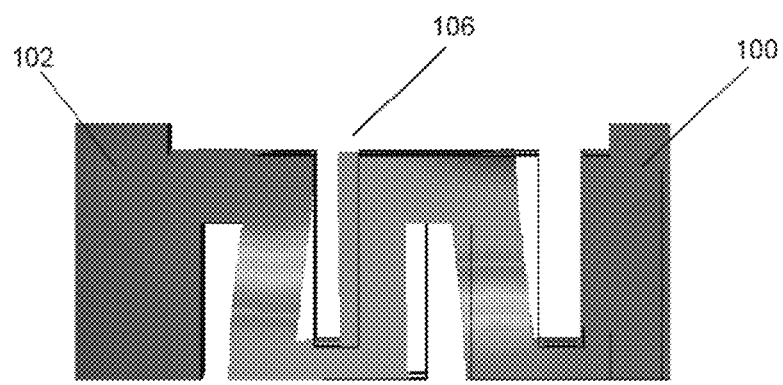
FIG. 10 illustrates an eigenmode in an anchor with two unit cells 210, according to some embodiments.

FIG. 10 illustrates exemplarily, by simulation, an eigenmode vibration in a repetitive anchor structure. Owing to symmetry, only half the structure is displayed. While step 3 is rather easy to fulfill as bandgaps are usually limited to only very specific frequency regions, to fulfill step 4, one has to consider the resonance condition of eigenmodes in the anchor structure, where all possible eigenmode wavenumbers in an repetitive anchor substantially are $$\beta_i = \frac{M}{N}i, i = 1, 2, \ldots \quad (4)$$

Figure 11:
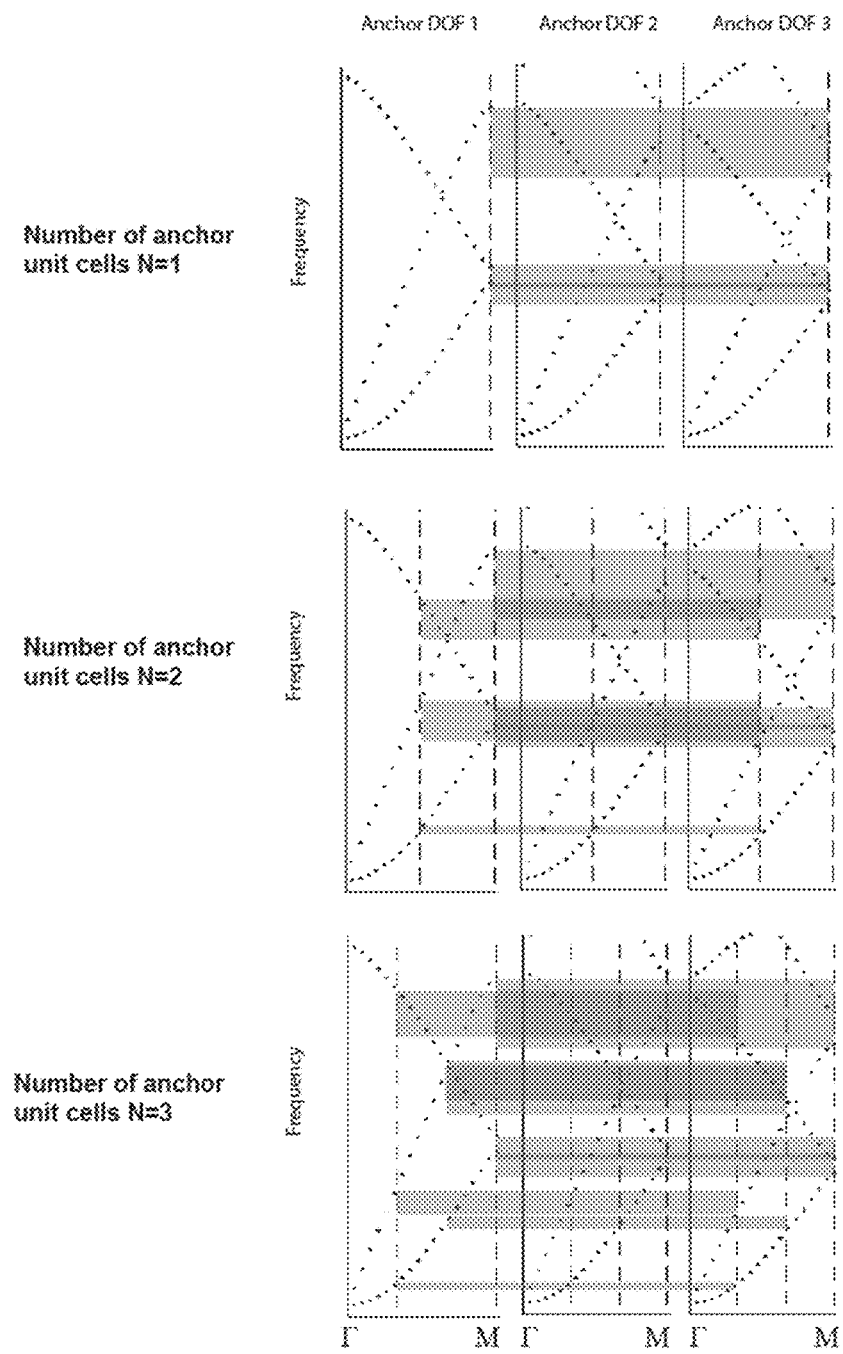
FIG. 11 illustrates eigenmode frequency range of a phononic crystal anchor in dependence on anchor DOF and number of repetitive elements, according to some embodiments.

For illustration purposes, FIG. 11 shows a magnification of FIG. 9 around the spurious mode region. FIG. 11 illustrates eigenmode frequency range of a phononic crystal anchor in dependence on anchor DOF (1, 2, or 3) and number of repetitive elements N. (Anchor DOF is represented by M in Eq. 4.) Exemplarily all possible wavenumber for a different unit cell number N are drawn as vertical broken lines. The shaded ("gray") boxes denote the frequency ranges of anchor eigenmodes. Eigenmode vibrations can be identified at the intersection of these vertical lines with the eigenmode curves. With increasing N, the number of possible eigenmodes in the anchor increases. It can be further observed that for different anchor DOF, the eigenmodes occur at different frequencies, and the gray boxes in FIG. 11 span up the change of frequency of a single eigenmode for variation of the anchor from anchor DOF 1 to anchor DOF 3.

For the spurious suppression by anchor eigenmodes this means that by varying the anchor from anchor DOF 1 to 3, it is possible suppress spurious modes in all frequency ranges spanned up by the gray boxes in FIG. 11. It can be easily observed from FIG. 11, that with increasing N, the possible frequency ranges for suppression of spurious modes increase rapidly and that finding a suitable parameter set of anchor DOF and number of elements N is easy to obtain with the displayed method.

The above method is well suited for predicting the eigenmode density and approximate resonance frequency of anchor eigenmodes, however, the intrinsic eigenmodes of the anchor may differ from the eigenmodes observable when taking into account the effect of the plate. Especially the modes having the strongest coupling to specific plate vibrations and hence are the most suitable modes for spurious suppression may be heavily distorted and also the observed frequency may deviate a significant amount from the frequency of the isolated anchor vibration.

It should be appreciated that there are also possible variations of creating an anchor eigenmode for spurious suppression, besides simultaneous variation of all unit cells at the same time. Specifically in addition to eigenmodes and vibrations occurring in the whole anchor structure, it may be sufficient to create only local vibrations in part of the anchor to increase the acoustic admittance and hence lower the Q of spurious modes.

Figure 12A:
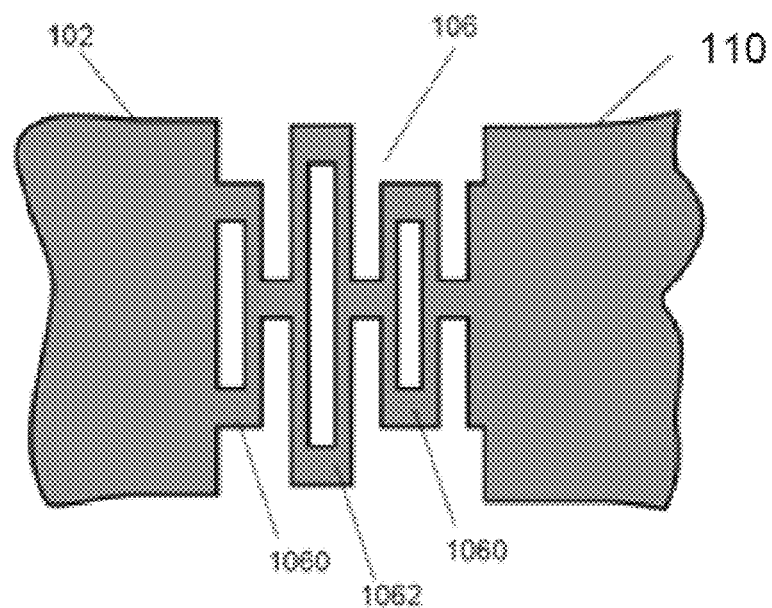
FIG. 12A is a schematic illustration of an anchor structure with variation of anchor DOF in one unit cell, according to some embodiments.
Figure 12B:
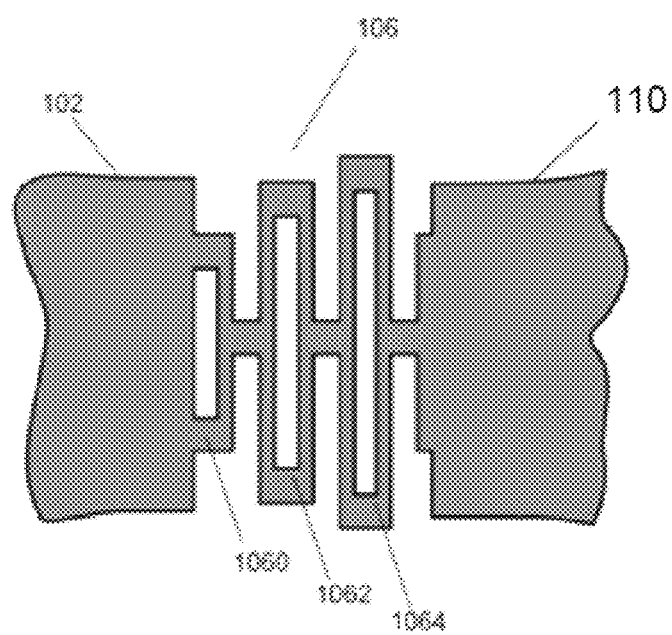
FIG. 12B is a schematic illustration of an anchor structure with variation of anchor DOF in multiple unit cells, according to some embodiments.
Figure 12C:
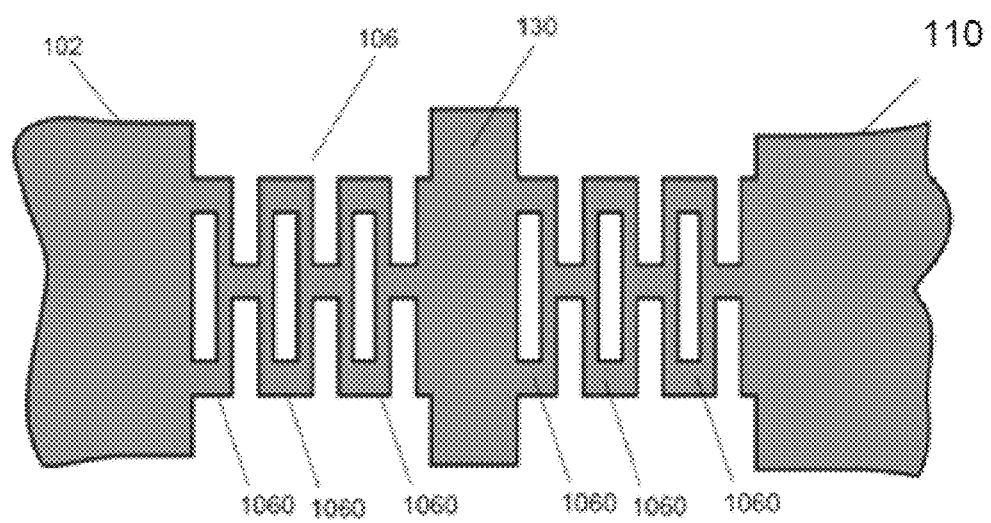
FIG. 12C is a schematic illustration of an anchor structure which includes an additional resonating element, according to some embodiments.

FIGS. 12A-12C illustrate some embodiments of phononic crystal anchors with spurious mode suppression by anchor eigenmodes. FIG. 12A displays a non-limiting example of a phononic crystal anchor, where specifically one unit cell 1062 differs from the other unit cells 1060. It should be appreciated that this may allow to specifically design the eigenmode vibration by the alteration of only a single unit cell, while the other unit cells control the coupling of the localized vibration to the spurious mode in the plate 110. It also should be appreciated that this design may be advantageous for simultaneous suppression of multiple spurious modes of vibration. It should be appreciated that eigenmode vibration shape may be very complex and as mentioned above it may occur localized in part of the anchor.

FIG. 12B illustrates another non-limiting example of a phononic crystal, where all unit cells 1060, 1062 and 1064 differ in at least one anchor DOF. It should be appreciated that each individual unit cell may be still in the acoustic bandgap of the main resonance frequency. It also may be that the elements closest to the plate 110 are in the acoustic bandgap, while the elements closest to the substrate 102 are not.

Each individual cell may also have a localized vibration with respect to a specific spurious mode of vibration, whereby the anchor suppresses multiple spurious modes of vibration simultaneously.

Alternatively, each individual cell may have a localized vibration with only a slightly different vibration around a single spurious frequency. It should be appreciated that this may increase the bandwidth of the spurious mode suppression, which may as a non-limiting example improve the manufacturability of the spurious mode suppression.

FIG. 12C illustrates another possible configuration of an anchor configuration for spurious suppression. The anchor consists of several unit cells 1060, which may or may not differ from each other. In addition to the unit cells, the anchor 106 also contains an additional vibrating element 130, which as a non-limiting example may be a simple plate. The vibration may then be substantially localized in this additional element.

Figure 13:
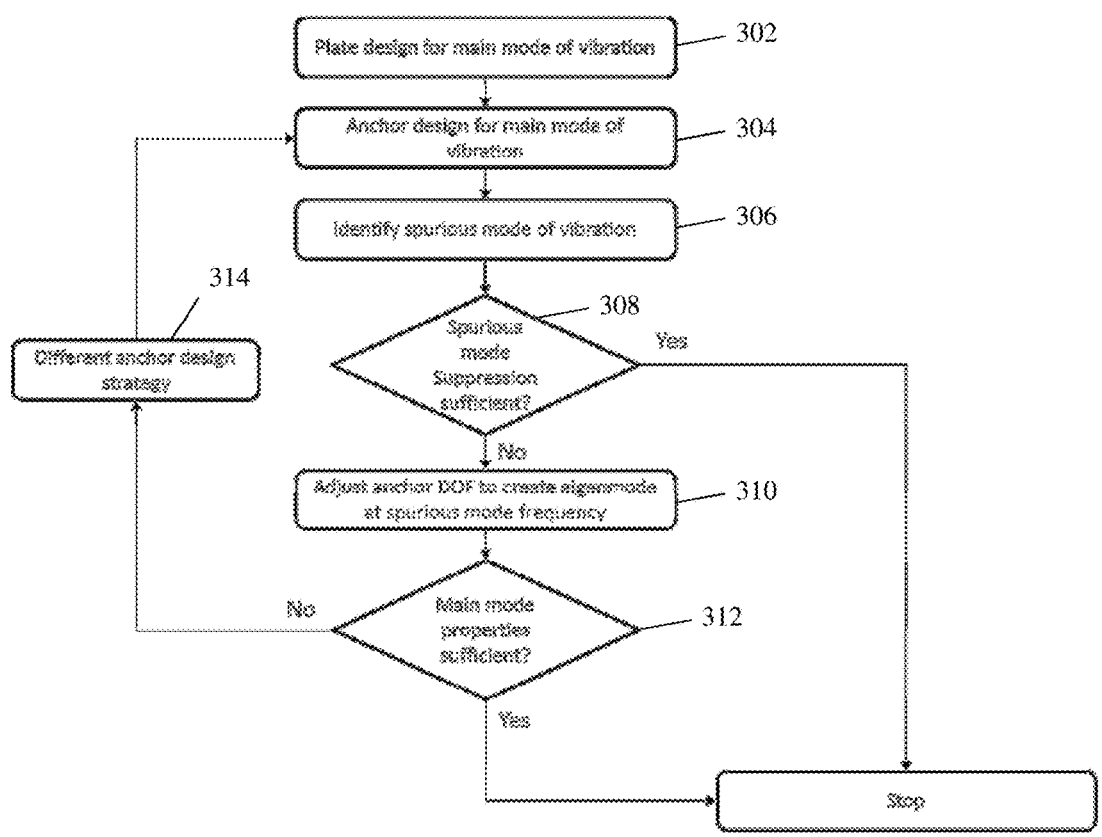
FIG. 13 is a block diagram of a flow-chart of a method for design of a resonator with suppression of spurious modes by the anchors, according to some embodiments.
Figure 14:
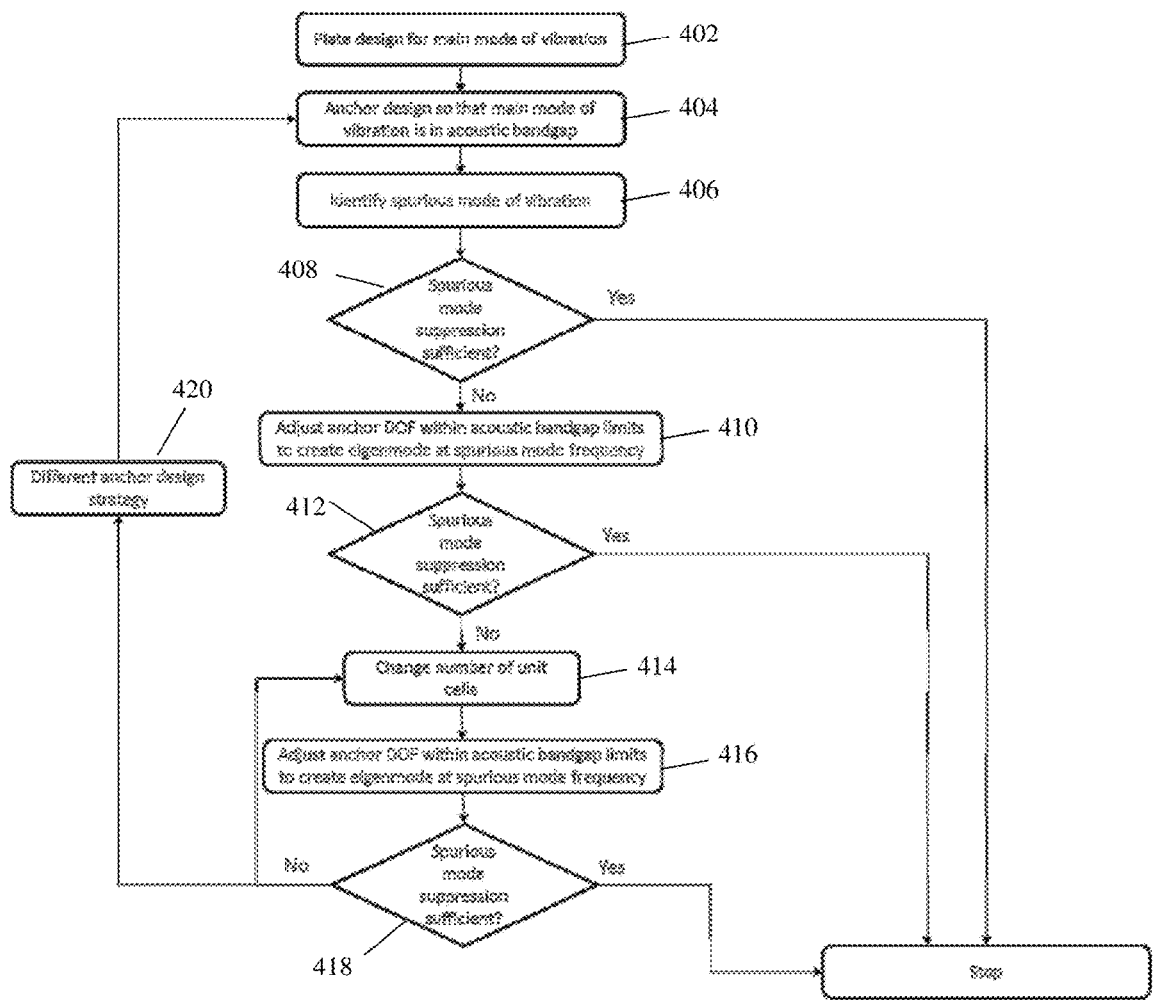
FIG. 14 is a block diagram of a flow-chart of a method for design of a resonator with suppression of spurious modes by phononic crystal anchors, where the main mode is in the (partial) bandgap of the anchor, according to some embodiments.

FIGS. 13 and 14 highlight the design method of this disclosures in terms of flow-charts.

FIG. 13 shows a flow-chart of a method for design of a resonator with suppression of spurious modes by the anchors, according to some embodiments. At step 302, plate 110 of resonator 100 is designed to support excitation of a desired main mode of resonance. At step 304, the anchors 106 of resonator 100 are designed to support excitation of the desired main resonance mode in plate 110. At step 306, a spurious mode of vibration of plate 110 is identified. At step 308, a determination is made as to whether spurious mode suppression is sufficient. If spurious mode suppression is sufficient, the method ends. Otherwise, at least one anchor DOF is adjusted at step 310 to facilitate creation of an eigenmode at the frequency of the spurious mode. At step 312, a determination is made as to whether properties of the main resonance mode are sufficient. If the properties of the main resonance mode are sufficient, the method ends. Otherwise, a different anchor design strategy is selected at step 314, and the method returns to step 304.

FIG. 14 shows a flow-chart of a method for design of a resonator with suppression of spurious modes by phononic crystal anchors, where the main mode is in the (partial) bandgap of the anchor, according to some embodiments. At step 402, plate 110 of resonator 100 is designed to support excitation of a desired main mode of resonance. At step 404, the anchors 106 of resonator 100 are designed so that the resonator's main resonance mode is in the acoustic bandgap. At step 406, a spurious mode of vibration of plate 110 is identified. At step 408, a determination is made as to whether spurious mode suppression is sufficient. If spurious mode suppression is sufficient, the method ends. Otherwise, at least one anchor DOF is adjusted at step 410, within acoustic bandgap limits, to facilitate creation of an eigenmode at the frequency of the spurious mode. At step 412, a determination is again made as to whether spurious mode suppression is sufficient. If spurious mode suppression is sufficient, the method ends. Otherwise, the number of unit cells in the anchor is changed at step 414. At step 416, at least one anchor DOF is adjusted, within acoustic bandgap limits, to facilitate creation of an eigenmode at the frequency of the spurious mode. At step 418, a determination is again made as to whether spurious mode suppression is sufficient. If spurious mode suppression is sufficient, the method ends. Otherwise, the method may return to step 414. Alternatively, the method may proceed to step 420, where a different anchor design strategy is chosen. From step 420, the method proceeds back to step 404.

Additional Description of Some Aspects of the Present Disclosure

The resonant frequency of a resonator (e.g., a MEMS resonator) may depend on the resonator's frequency. Thus, variation in the temperature of a resonator may lead to variation or instability in the resonator's resonance frequency. In some embodiments an electrical heater may be co-located with a resonator (e.g., disposed on or integrated with the resonator's mechanical resonating structure) to regulate the resonator's temperature. In some embodiments, a sensor (e.g., temperature sensor or frequency sensor) may be co-located with a resonator (e.g., disposed on or integrated with the resonator's mechanical resonating structure) to sense the resonator's temperature and/or frequency and to control systems that regulate the resonator's temperature and/or frequency.

Resonator anchors may be configured to thermally insulate a mechanical resonating structure from its ambient environment. Also, resonator anchors may be configured to facilitate routing of electrical signals (e.g., via electrical wires or traces) between a mechanical resonating structure and other portions of a chip.

It should be understood that the various embodiments shown in the figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

The invention claimed is:

1. A device comprising:
a micro-electromechanical (MEMS) resonating structure,
a substrate, and
anchors between the MEMS resonating structure and the substrate,
wherein the MEMS resonating structure has at least one main eigenmode of vibration and at least one spurious eigenmode of vibration differing from the at least one main eigenmode of vibration, and
wherein at least one anchor of the anchors comprises a plurality of repeating rectangular units defining for the anchor an eigenmode of vibration substantially matching the at least one spurious eigenmode of vibration of the MEMS resonating structure.

2. The device of claim 1, wherein a first rectangular unit of the plurality of repeating rectangular units of the at least one anchor of the anchors is uniquely sized compared to other rectangular units of the plurality of repeating rectangular units.

3. The device of claim 1, wherein the at least one anchor of the anchors comprises a main beam and a contact portion in contact with the MEMS resonating structure or the substrate, wherein a width of the contact portion along a direction of a contact interface between the contact portion and the MEMS resonating structure or the substrate is greater than a width of the main beam along the direction of the contact interface.

4. The device of claim 1, wherein the anchors have at least one eigenmode of vibration, wherein each one of the at least one eigenmode of vibration for the anchors differs from the main eigenmode of vibration.

5. The device of claim 1, wherein at least one of the anchors is, at least in part, a phononic crystal structure comprising two or more substantially identical units.

6. The device of claim 1, wherein the at least one anchor of the anchors further comprises an anchor contact portion in contact with the MEMS resonating structure or the substrate at two or more locations.

7. The device of claim 5, wherein the phononic crystal structure has an acoustic bandgap at a frequency of the main eigenmode of vibration of the MEMS resonating structure.

8. The device of claim 5, wherein the frequency of the main eigenmode of vibration of the MEMS resonating structure is in an acoustic bandgap of the phononic crystal structure.

9. The device of claim 5, wherein a first unit of the phononic crystal structure is different than a second unit of the phononic crystal structure to create an eigenmode resonance at a frequency of the spurious eigenmode of vibration of the MEMS resonating structure.

10. The device of claim 5, wherein the at least one anchor includes the phononic crystal structure and a second structure, the second structure having an eigenmode resonance at a frequency of the spurious eigenmode of vibration of the MEMS resonating structure.

11. The device of claim 5, wherein the at least one anchor has multiple resonances at multiple respective spurious mode frequencies of the MEMS resonating structure.

12. The device of claim 5, wherein the at least one anchor has at least two eigenmodes of vibration at frequencies approximately equal to the at least one spurious eigenmode of the MEMS resonating structure, and wherein the phononic crystal structure further comprises at least two units of different designs.

13. A device comprising:
a micro-electromechanical (MEMS) resonating structure,
a substrate, and
anchors between the MEMS resonating structure and the substrate,
wherein the MEMS resonating structure has at least one main eigenmode of vibration and at least one spurious eigenmode of vibration differing from the at least one main eigenmode of vibration, and
wherein at least one anchor of the anchors comprises a main beam and plurality of repeating open-ended units extending outwardly from the main beam and defining for the anchor an eigenmode of vibration substantially matching the spurious eigenmode of vibration of the MEMS resonating structure.

14. The device of claim 13, wherein a first of the plurality of repeating open-ended units comprises at least one pair of elements disposed symmetrically on opposite sides of the main beam and connected to the main beam.

15. The device of claim 14, wherein the at least one pair of elements form a cross structure.

16. The device of claim 14, wherein the at least one pair of elements comprise a pair of curved structures facing away from the main beam.

17. A device comprising:
a micro-electromechanical (MEMS) resonating structure,
a substrate, and
anchors between the MEMS resonating structure and the substrate,
wherein the MEMS resonating structure has at least one main eigenmode of vibration and first and second spurious eigenmodes of vibration differing from the at least one main eigenmode of vibration, and
wherein at least one anchor of the anchors comprises a plurality of units of substantially the same shape defining for the anchor first and second eigenmodes of vibration substantially matching the first and second spurious eigenmodes of vibration of the MEMS resonating structure.

18. The device of claim 17, wherein the at least one anchor of the anchors comprises
a first unit of the plurality of units that is uniquely sized compared to other units of the plurality of units.

19. The device of claim 17, wherein at least one of the anchors is, at least in part, a phononic crystal structure comprising two or more substantially identical units.

20. The device of claim 19, wherein a first unit of the phononic crystal structure is different than a second unit of the phononic crystal structure to create an eigenmode resonance at a frequency of the first spurious eigenmode of vibration of the MEMS resonating structure.

* * * * *